United States Patent
Miethe et al.

(10) Patent No.: US 12,158,305 B2
(45) Date of Patent: Dec. 3, 2024

(54) METHODS AND SYSTEMS FOR COOLING A HEATING ELEMENT

(71) Applicant: Kanthal GmbH, Mörfelden-Walldorf (DE)

(72) Inventors: Ralph Miethe, Hessen (DE); Markus Mann, Hessen (DE)

(73) Assignee: Kanthal GmbH, Mörfelden-Walldorf (DE)

( * ) Notice: Subject to any disclaimer, the term of this patent is extended or adjusted under 35 U.S.C. 154(b) by 938 days.

(21) Appl. No.: 17/126,101

(22) Filed: Dec. 18, 2020

(65) Prior Publication Data

US 2021/0190429 A1   Jun. 24, 2021

(30) Foreign Application Priority Data

Dec. 23, 2019 (EP) .................................... 19219573

(51) Int. Cl.
| | |
|---|---|
| *F27B 3/24* | (2006.01) |
| *F27D 11/00* | (2006.01) |
| *H01L 21/67* | (2006.01) |
| *H01L 23/467* | (2006.01) |
| *H05B 1/00* | (2006.01) |

(52) U.S. Cl.
CPC ................ *F27B 3/24* (2013.01); *F27D 11/00* (2013.01); *H01L 21/67098* (2013.01); *H01L 23/467* (2013.01); *H05B 1/00* (2013.01)

(58) Field of Classification Search
CPC ... H01B 1/00; F27B 3/24; F27D 11/00; H01L 21/67098; H01L 23/467; H05B 1/00
See application file for complete search history.

(56) References Cited

U.S. PATENT DOCUMENTS

| | | | |
|---|---|---|---|
| 5,128,515 A * | 7/1992 | Tanaka ................ | C23C 16/4411 219/390 |
| 11,795,857 B2 | 10/2023 | Pradun et al. | |
| 2005/0160988 A1 | 7/2005 | Shinma et al. | |
| 2010/0096109 A1* | 4/2010 | Zhang ............... | H01J 37/32724 165/104.19 |
| 2011/0147363 A1* | 6/2011 | Yap ................... | H01L 21/68792 219/385 |
| 2011/0220631 A1 | 9/2011 | Grudin et al. | |

(Continued)

FOREIGN PATENT DOCUMENTS

| | | |
|---|---|---|
| CN | 102844854 A | 12/2012 |
| CN | 102914168 B | 5/2015 |

(Continued)

OTHER PUBLICATIONS

Machine Translation of Yap (CN 102844854), performed on Mar. 27, 2024 (Year: 2012).*

(Continued)

*Primary Examiner* — Brian W Jennison
(74) *Attorney, Agent, or Firm* — Morgan, Lewis & Bockius LLP

(57) ABSTRACT

Method for cooling a heating element of an electric heater in a thermal process cycle comprising the steps of cooling the heating element at a first cooling rate from a first temperature to a second temperature and cooling the heating element at a second cooling rate from the second temperature to a third temperature, wherein the second cooling rate is faster than the first cooling rate.

15 Claims, 3 Drawing Sheets

(56) References Cited

U.S. PATENT DOCUMENTS

2013/0062333 A1    3/2013  Emami
2014/0175084 A1    6/2014  Ji et al.
2019/0380530 A1*  12/2019  Mueller ................ A47J 31/007

FOREIGN PATENT DOCUMENTS

| CN | 207455063 U | 6/2018 |
| CN | 108884734 A | 11/2018 |
| EP | 3421621 A1 | 1/2019 |
| TW | 200527935 A | 8/2005 |

OTHER PUBLICATIONS

Extended European Search Report dated Jun. 19, 2020, issued in corresponding European Patent Application No. 19219573.3.
Translation of Office Action dated Dec. 29, 2023, issued in corresponding Chinese Patent Application No. 202011520615.9.

* cited by examiner

METHODS AND SYSTEMS FOR COOLING A HEATING ELEMENT

RELATED APPLICATION DATA

This application is based on and claims priority under 37 U.S.C. § 119 to European Application No. EP 19219573.3, filed Dec. 23, 2019, the entire contents of which are incorporated herein by reference.

TECHNICAL FIELD

The present disclosure relates generally to methods, systems and computer programs for cooling a heating element of an electric heater in a thermal process cycle.

BACKGROUND

Electric heaters, particularly electric flow heaters, comprise heating elements and are used for heating a flow of a fluid. The heaters are adapted for having a through-flow of a fluid, wherein the heating elements are positioned in tubes within the electric heaters and the fluid flows through the electric heater whereby heat is transferred. The fluid typically enters into a tube in the heating element through a first open end, passes the wire within the tube, and then exits through a second opening of the tube.

The heating elements within the tubes may deteriorate with use, due to various reasons. One of the reasons is when heating the heating elements, a fast temperature increase is preferred in terms of efficiency, since this will decrease the time needed to finish the thermal cycling process. After the elements have been heated, they also need to cool, where once again a fast decrease in temperature is preferred, for the same reasons as above. However, it has been shown heating elements tend to deteriorate faster at higher temperature change rates, which will create a trade-off between speed and longevity of the heating elements.

Consequently, there exists a need for improvement when it comes to heating elements, more particularly when it comes to heating elements in form of wires within electric heaters. It would be desirable to find solutions which would reduce and/or improve at least one of the problems mentioned above, such as improving the speed and/or longevity of heating elements in electric heaters.

SUMMARY

It is therefore an aspect of the present disclosure to address at least some of the problems and issues outlined above. An aspect of embodiments of the disclosure is to improve the longevity of heating elements in an electric heater, such as an electric flow heater. Another aspect of the present disclosure is to decrease the cycle time for a thermal process cycle of an electric heater, such as an electric flow heater. The present disclosure therefore relates to methods, systems and computer programs as defined in the attached claims.

Hence, the present disclosure provides a method for cooling (reducing the temperature of) a heating element of an electric heater, such as an electric flow heater in a thermal process cycle. The method comprises the steps of cooling the heating element at a first cooling rate from a first temperature to a second temperature, and then cooling the heating element at a second cooling rate from the second temperature to a third temperature, wherein the second cooling rate is faster than the first cooling rate.

Furthermore, the present disclosure relates to a system for cooling (reducing the temperature of) a heating element. The system comprises an electric heater, such as an electric flow heater comprising the heating element, and a temperature sensor arranged to collect temperature information from the heating element. The system further comprises processing circuitry operatively connected to the heating element and to the temperature sensor and a memory. The memory contains instructions executable by said processing circuitry whereby said system is operative for cooling the heating element at a first cooling rate from a first temperature to a second temperature, and cooling the heating element at a second cooling rate from the second temperature to a third temperature.

Additionally, the present disclosure also provides computer programs and carriers, the details of which will be described in the claims and the detailed description.

Further possible features and benefits of this solution will become apparent from the detailed description below.

BRIEF DESCRIPTION OF DRAWINGS

The solution will now be described in more detail by means of exemplary embodiments and with reference to the accompanying drawings, in which.

DETAILED DESCRIPTION

Figure 1:
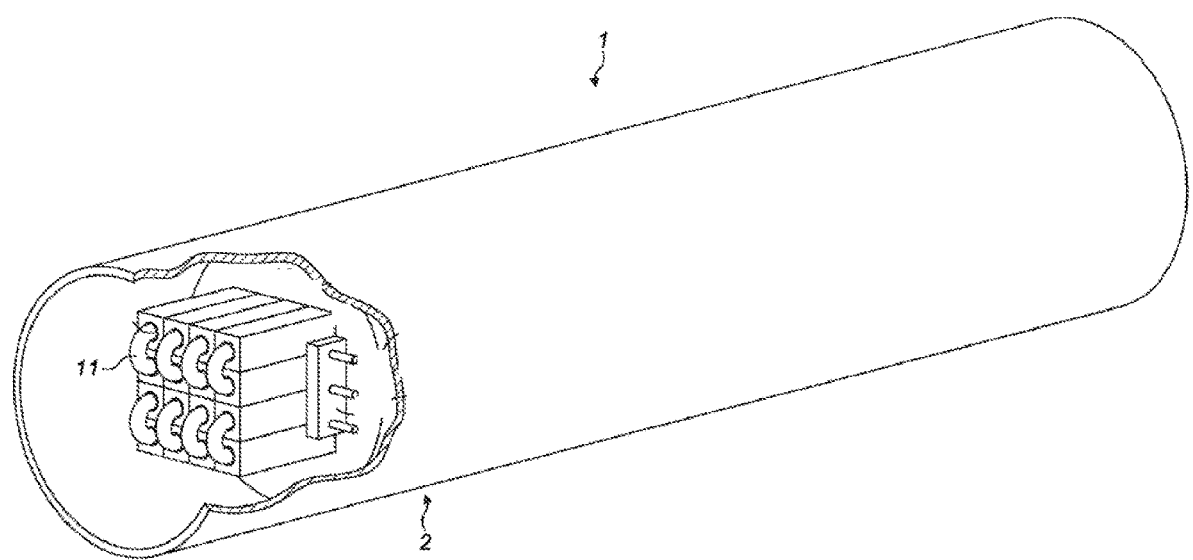
FIG. 1 show an example of an electric heater, such as an electric flow heater for which the present disclosure is applicable.

The present disclosure relates to methods, systems and computer programs for a method of cooling a heating element in an electric heater, particularly a heating element in the form of a metallic wire in an electric flow heater. Shortly described, a method for cooling a heating element is provided, which method is performed after a heating element has been heated to a first temperature. The heating element is cooled at a first cooling rate from the first temperature to a second temperature, the second temperature being lower than the first temperature, and then the cooling rate is increased to a second cooling rate, which is higher than the first cooling rate, whereafter the heating element is cooled at the second cooling rate to a third temperature, wherein the third temperature is lower than the second temperature. In some embodiments, the first, slower, cooling rate is achieved by alternately turning on and off the power fed to the heating element, or by decreasing the voltage or power fed to the heating element. The second, faster, cooling rate may be achieved by reducing, which includes completely turning off, the power fed to the heating element, while keeping the fluid flow, typically airflow, at a constant rate.

Extensive experiments on the behavior of such heating elements have been carried out, and the insights gained from these experiments are the basis for the present disclosure. Many users of electric heaters use them in a cycling mode, i.e. where they both ramp up the temperature of the heating elements and then cool them down again. One of the key insights is that it is mainly the cool-down speed of the heating elements which is detrimental to the longevity of the heating elements. When cooling the element, the rate of temperature decrease should be slow, to begin with. Another key insight is that it is mainly at the higher ranges of temperatures reached by the heating elements that a fast cooldown speed is highly detrimental. This leads to the solution described herein, where the heating elements are first cooled at a relatively slow pace from a first, relatively high, temperature, to a second temperature, which is lower than the first temperature. In other words, the cooling above the second temperature should be performed slowly, and the cooling after the second temperature has been reached should be performed more quickly. After the heating element has reached the second temperature, the cooling rate may be increased several times compared with the slower rate, which increases the lifetime of the heating element compared to methods which keeps a constant cooling rate all the time.

The experiments have shown that by using methods and systems according to the present disclosure, the lifetime of a heating element in an electric heater may be extended from approximately 1200 thermal cycles, to 2000-7000 cycles, while also shortening the time for a cycle from approximately 36 minutes to approximately 14 minutes.

In the present disclosure, the terms "approximately" or "about" are meant +/−10% of the numerical value given.

A problem which is solved or at least alleviated with the teachings of the present disclosure is the deterioration of the heating elements due to tensions and permanent elongations caused by repeated heating and cooling of the elements. The heating elements will form and build an oxide when in contact with oxygen (alumina will form a ceramic layer which protects the heating element from further oxidation and scaling). However, the thermal expansion of the metal in the heating element is higher than the thermal expansion of the layer, which can result in cracks in the oxide layer as the heating element is heated. The element will be exposed to oxygen through these cracks, such that new alumina builds and fills the cracks. When the element cools down again, the new ceramic matrix blocks thermal contraction of the metal matrix, causing tensions and a permanent elongation of the element, which eventually will destroy it. The teachings of the present disclosure may improve the life length of a heating element, and also decrease the time for a thermal process cycle, especially for the cooldown part of it.

Referring to FIG. 1, an example of an electric heater, in this case an electric flow heater, for which the present disclosure is applicable will now be described. It should be noted that the heater of FIG. 1 is merely an exemplary electric heater, the method may be applicable for any electric heater with heating elements, such as a furnace. The method is suitable for heating elements comprising metal alloys, particularly for heating elements comprising an iron-chromium-aluminum (Fe—Cr—Al) alloy or a nickel-chrome-iron (Ni—Cr—Fe) alloy.

The electric heater 1 comprises a casing 2 in a form of a cylindrical sheath. A heating assembly is mounted within chamber. The heating assembly is formed from a plurality of lengthwise elongate jacket elements.

Reference within the present disclosure to 'heating element' encompasses relatively thin wires and larger cross sectional heating rods. Such a heating rod or wire may in some embodiments comprise an iron-chromium-aluminum (Fe—Cr—Al) alloy or a nickel-chrome-iron (Ni—Cr—Fe) alloy. Thin wire with a small cross section is suitable provided it is sufficiently rigid and stable to extend linearly along the axis of each bore.

The electric heater 1 may further comprise a sensor for sensing the temperature of the heating element 11, which may be e.g. a thermocouple. The electric heater 1 is connectible to a power source through which electric power is fed to the electric heater. The heating elements 11 are adapted to, when powered by electricity, transfer heat to a fluid passing through the electric heater 1 with the purpose of heating the fluid. In some embodiments, the fluid is air.

Looking now at FIG. 2, in combination with FIG. 1, steps of a method for controlling the temperature of a heating element 11 of a heater 1 according to the present disclosure will now be described, particularly for cooling the heating element 11. The method is typically performed on a heating element which has already been heated up, wherein the cooling down of the heating element 11 may be seen as part of a thermal cycle comprising first heating the element and then cooling the heating element 11.

The method comprises cooling 102 the heating element 11 at a first cooling rate from a first temperature to a second temperature, wherein the second temperature is lower than the first temperature. The method further comprises cooling 106 the heating element 11 at a second cooling rate from the second temperature to a third temperature, wherein the second cooling rate is faster than the first cooling rate, and wherein the third temperature is lower than the second temperature.

Described in other words, the method comprises cooling the heating element 11 relatively slowly above a certain temperature, i.e. the second temperature, and then cooling it more quickly after the second temperature has been reached. One reason for such a threshold temperature is that the characteristics of the metals in the heating elements differ depending on the current temperature of the heating element 11, and below a certain temperature the characteristics change in such a way that faster cooldown is preferable both for shortening the time of a thermal process cycle, and for increasing the lifetime of a heating element 11.

In some embodiments, the second cooling rate is significantly higher than the first cooling rate. In some embodiments, the second cooling rate may be between 3 and 10 times as high as the first cooling rate, preferably approximately 6 times as high. As will be understood, the increase of the first cooling rate to the second cooling rate is not always instantaneous, although it may be, it may also occur during a relatively short period of time.

In some embodiments, the temperature range above which the heating element 11 should be cooled more slowly, i.e. the second temperature, is in the range of 900-1000° C., such as approximately 1000° C. The value of the second temperature will vary depending on which material the heating elements are composed of, and the temperature range of 900-1000° C. is applicable for at least heating elements comprising an iron-chromium-aluminum (Fe—Cr—Al) alloy, a nickel-chrome-iron (Ni—Cr—Fe) alloy, or similar alloys.

In some embodiments, the first temperature, i.e. the temperature to which the heating element has been heated before it is to be cooled, is approximately 1200° C. In some embodiments, the third temperature, i.e. the temperature the heating element is cooled to using the second cooling rate, is approximately room temperature.

In some embodiments, the method further comprises collecting 106 temperature information from the heating element 11, and controlling at least one of the first and second cooling rates based on the collected temperature information. The temperature information may be gathered by using e.g. a temperature sensor mounted in the electric heater.

In some embodiments, at least one of the cooling rates is controlled by adapting power fed to the heating element 11.

In such embodiments, the cooling rate would typically be increased when the power fed to the heating element 11 is decreased, and the cooling rate would decrease if the power fed to the heating element 11 is increased.

In some embodiments, cooling the heating element 11 at the second cooling rate comprises reducing power fed to the heating element 11, while keeping the fluid flow constant, wherein the fluid is typically air. This results in forced convection, thereby cooling the heating element 11. The second cooling rate will in such embodiments be relatively stable but may decrease slightly as the heating element 11 becomes cooler. In some embodiments, reducing the power fed comprises completely turning off the power fed to the heating element 11.

In some embodiments, the cooling rate of the heating element 11 is controlled by adapting the voltage fed to the heating element 11.

In some embodiments, the cooling rate of the heating element 11 is controlled by adjusting the fluid flow in the electric heater, which entails that the cooling rate is controlled by forced convection. Typically, the higher the fluid flow, the faster the heating element 11 cools down when the power to the heating element 11 is turned off.

In some embodiments, the power fed to the heating element 11 can only be turned on or off at a predetermined power level. In such embodiments, adapting the power fed to the heating element 11 comprises alternately turning the power on and off, preferably in such a way as to maintain a relatively stable cooling rate. The cycles between turning the power on and off can be relatively short, in some embodiments less than 1 second, so it may still have virtually the same effect as lowering the power fed to the heating element 11.

In some embodiments, cooling the heating element 11 at the second cooling rate comprises reducing the fluid flow in the electric heater as well as the power. In such embodiments, the second cooling rate may be slower than when the fluid flow is not turned off, and it may also decrease more over time than if the fluid flow is flowing normally. In such embodiments, the second cooling rate may be about 100° C./min. In some embodiments, reducing the fluid flow comprises completely turning off the fluid flow.

In some embodiments, the method comprises increasing the first cooling rate during the cooling between the first temperature and the second temperature. In such embodiments, the ramp rate of the first cooling rate may be 10° C./min$^2$. In embodiments wherein the first temperature is 1200° C. and the second temperature is 1000° C., this entails that the second temperature would be reached after about 4.47 minutes. This may be expressed by the following: $T(t)=T_0-10K/min^2*t^2$, wherein T is the temperature in ° C., $T_0$ is 1200° C. and t is the time in minutes.

In some embodiments, the method comprises increasing the second cooling rate during the cooling between the second temperature and the third temperature.

In some embodiments, the first cooling rate is between 3° and 60° C./min, such as approximately 50° C./min.

In some embodiments, the second cooling rate is between 10° and 400° C./min, such as approximately 300° C./min.

In some embodiments, the heating element 11 comprises an iron-chromium-aluminium (Fe—Cr—Al) alloy or a nickel-chrome-iron (Ni—Cr—Fe) alloy.

In some embodiments, the method further comprises, prior to the cooling 102, heating the heating element 11 to the first temperature. In some embodiments, the heating of the heating element 11 is performed with a heating rate of approximately 250° C./min.

Looking now at FIG. 3, in combination with FIGS. 1 and 2, a block schematic of a system 600 operable for cooling a heating element 11 of a heater in a thermal process cycle will now be described.

Figure 2:
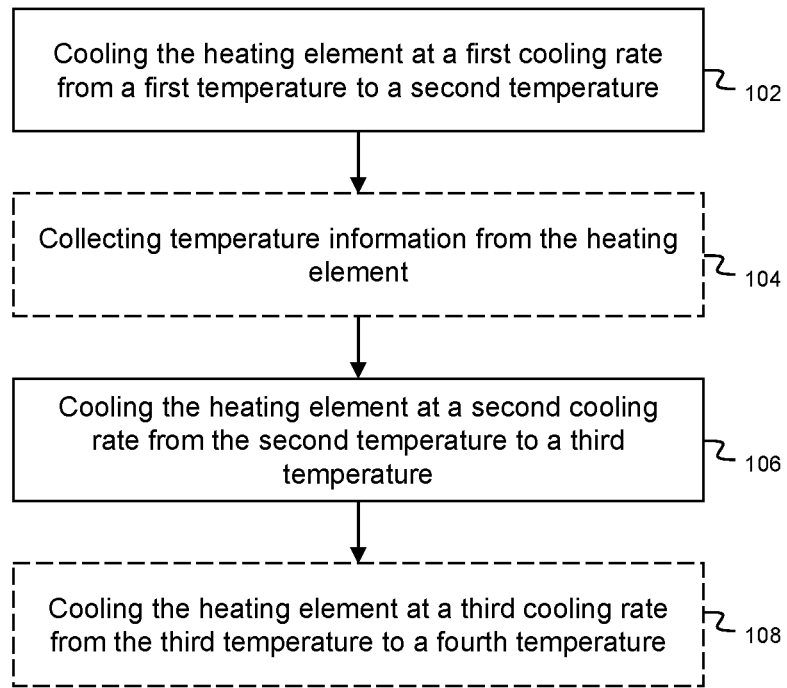
FIG. 2 schematically shows steps of an embodiment of a method for cooling a heating element.
Figure 3:
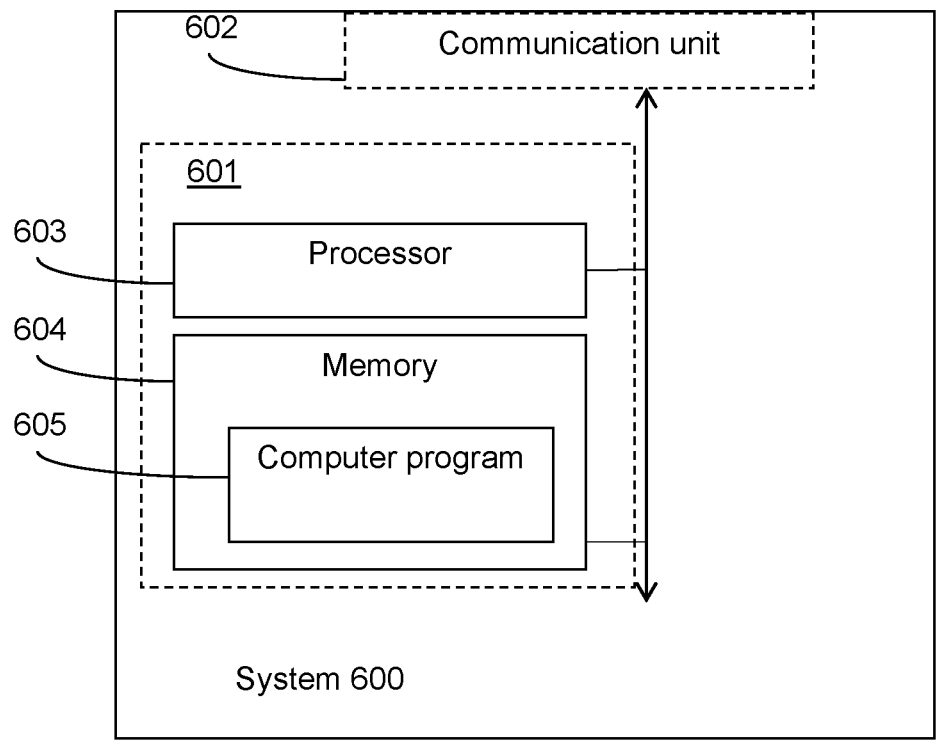
FIG. 3 shows a block schematic a system configured for cooling a heating element.

FIG. 3, in conjunction with FIGS. 1 and 2, shows a block schematic of a system 600, operable for cooling a heating element 11 of an electric heater 1. The system 600 comprises an electric heater 1 as described in connection with FIGS. 1 and 2 above, comprising a heating element 11. The system 600 further comprises processing circuitry 603 and a memory 604. The processing circuitry 603 may comprise one or more programmable processor, application-specific integrated circuits, field programmable gate arrays or combinations of these (not shown) adapted to execute instructions. The memory contains instructions executable by said processing circuitry, whereby the system 600 is operative for cooling the heating element 11 at a first cooling rate from a first temperature to a second temperature, and cooling the heating element 11 at a second cooling rate from the second temperature to a third temperature, wherein the second cooling rate is faster than the first cooling rate.

The system 600 that performs the method may be a group of devices, wherein functionality for performing the method are spread out over different physical, or virtual, devices of the system. In other words, the system 600 for cooling a heating element 11 may be a cloud-solution, i.e. the system 600 may be deployed as cloud computing resources that may be distributed in the system 600. In some embodiments, the system may also comprise the electric heater 11 a According to an embodiment, the system 600 is further operative for reducing power fed to the heating element 11.

According to an embodiment, the system 600 is further operative for alternately turning on and off the power fed to the heating element 11.

According to an embodiment, the system 600 is further operative for reducing the fluid flow in the electric heater (1).

According to an embodiment, the system 600 is further operative for controlling the cooling rate of the heating element 11 by adapting the voltage fed to the heating element 11.

According to an embodiment, the system 600 is further operative for collecting temperature information from the heating element 1, and further operative for controlling at least one of the first and the second cooling rates based on to the collected temperature information.

According to an embodiment, the system 600 is further operative for controlling the cooling rate by forced convection, i.e. controlling at least one of the first, second and third cooling rates by forced convection.

According to an embodiment of the system 600, the first cooling rate is from 30 to 50° C./min.

According to an embodiment of the system 600, the second cooling rate is from 100 to 400° C./min.

According to an embodiment of the system 600, the second temperature is approximately 1000° C.

According to an embodiment, the system 600 is further operative for cooling the heating element 11 from the third temperature to a fourth temperature at a third cooling rate, wherein the third cooling rate is faster than the first cooling rate but slower than the second cooling rate, wherein cooling the heating element 11 at the second cooling rate comprises reducing the power fed to the heating element 11 while keeping the fluid flow constant, and further wherein cooling the heating element 11 at the third cooling rate comprises reducing the fluid flow in the electric heater 1.

According to other embodiments, the system 600 may further comprise a communication unit 602, which may be considered to comprise conventional means for communicating with other entities connected to the electric heater. The instructions executable by said processing circuitry 603 may be arranged as a computer program 605 stored e.g. in the memory 604. The processing circuitry 603 and the memory 604 may be arranged in a sub-arrangement 601. The sub-arrangement 601 may be a micro-processor and adequate software and storage therefore, a Programmable Logic Device, PLD, or other electronic component(s)/processing circuit(s) configured to perform the methods mentioned above.

The computer program 605 may comprise computer readable code means, which when run in a system 600 causes the system 600 to perform the steps described in any of the described embodiments of the system 600. The computer program 605 may be carried by a computer program product connectable to the processing circuitry 603. The computer program product may be the memory 604. The memory 604 may be realized as for example a RAM (Random-access memory), ROM (Read-Only Memory) or an EEPROM (Electrical Erasable Programmable ROM). Further, the computer program may be carried by a separate computer-readable medium, such as a CD, DVD or flash memory, from which the program could be downloaded into the memory 604. Alternatively, the computer program may be stored on a server or any other entity connected to which the system has access via the communication unit 602. The computer program may then be downloaded from the server into the memory 604.

Although the description above contains a plurality of specificities, these should not be construed as limiting the scope of the concept described herein but as merely providing illustrations of some exemplifying embodiments of the described concept. It will be appreciated that the scope of the presently described concept fully encompasses other embodiments which may become obvious to those skilled in the art, and that the scope of the presently described concept is accordingly not to be limited. Reference to an element in the singular is not intended to mean "one and only one" unless explicitly so stated, but rather "one or more". All structural and functional equivalents to the elements of the above-described embodiments that are known to those of ordinary skill in the art are expressly incorporated herein by reference and are intended to be encompassed hereby. Moreover, it is not necessary for an apparatus or method to address each and every problem sought to be solved by the presently described concept, for it to be encompassed hereby. In the exemplary figures, a broken line generally signifies that the feature within the broken line is optional.

The invention claimed is:

1. A method for cooling a heating element of an electric heater in a thermal process cycle, comprising the steps of:
cooling the heating element at a first cooling rate from a first temperature to a second temperature;
cooling the heating element at a second cooling rate from the second temperature to a third temperature; and
cooling the heating element from the third temperature to a fourth temperature at a third cooling rate,
wherein the second cooling rate is faster than the first cooling rate,
wherein the third cooling rate is faster than the first cooling rate but slower than the second cooling rate,
wherein cooling the heating element at the second cooling rate comprises reducing the power fed to the heating element while keeping the fluid flow constant, and
wherein cooling the heating element at the third cooling rate comprises reducing the fluid flow in the electric heater.

2. The method according to claim 1, wherein the second cooling rate is at least three times as high as the first cooling rate.

3. The method according to claim 1, further comprising:
collecting temperature information from the heating element,
wherein at least one of the first and the second cooling rates is controlled based on the collected temperature information.

4. The method according to claim 1, wherein the heating element comprises a (Fe—Cr—Al) alloy or a nickel-chrome-iron (Ni—Cr—Fe) alloy.

5. The method according to claim 1, wherein the first cooling rate is from 30 to 50° C./min.

6. The method according to claim 1, wherein the second cooling rate is from 100 to 400° C./min.

7. The method according to claim 1, wherein the second temperature is approximately 1000° C.

8. A non-transitory computer readable storage medium storing one or more programs configured for execution by processing circuitry of an electronic device, the one or more programs including instructions to perform the method according to claim 1.

9. An electronic device for controlling cooling of a heating element, comprising:
processing circuitry; and
memory storing one or more programs configured for execution by the processing circuitry, the one or more programs including instructions to perform the method according to claim 1.

10. The method according to claim 1, further comprising:
collecting temperature information from the heating element and controlling at least one of the first and the second cooling rates based on the collected temperature information,
wherein the second cooling rate is at least three times as high as the first cooling rate, and
wherein the heating element comprises a (Fe—Cr—Al) alloy or a nickel-chrome-iron (Ni—Cr—Fe) alloy.

11. A non-transitory computer readable storage medium storing one or more programs configured for execution by processing circuitry of an electronic device, the one or more programs including instructions to perform the method according to claim 10.

12. An electronic device for controlling cooling of a heating element, comprising:
processing circuitry; and
memory storing one or more programs configured for execution by the processing circuitry, the one or more programs including instructions to perform the method according to claim 10.

13. A system for cooling a heating element, comprising:
an electric heater comprising the heating element;
a temperature sensor arranged to collect temperature information from the heating element;
processing circuitry operatively connected to the heating element and to the temperature sensor; and
a memory, said memory containing instructions executable by said processing circuitry, whereby said system is operative for:
cooling the heating element at a first cooling rate from a first temperature to a second temperature;
cooling the heating element at a second cooling rate from the second temperature to a third temperature; and cooling the heating element from the third temperature to a fourth temperature at a third cooling rate, wherein the second cooling rate is faster than the first cooling rate, wherein, during the step of cooling the heating element at the first cooling rate, a fluid flow through the heating element is at a first rate, wherein, during the step of cooling the heating element at the second cooling rate, the fluid flow through the heating element is at a second rate, wherein the second rate is less than the first rate, wherein the third cooling rate is faster than the first cooling rate but slower than the second cooling rate, wherein cooling the heating element at the second cooling rate comprises reducing the power fed to the heating element while keeping the fluid flow constant, and wherein cooling the heating element at the third cooling rate comprises reducing the fluid flow in the electric heater.

14. The system according to claim 13, further operative for performing one or more of the following:

adapting the voltage fed to the heating element to control the second cooling rate of the heating element, and collecting temperature information from the heating element and controlling at least one of the first and the second cooling rates based on the collected temperature information, wherein the second cooling rate is at least three times as high as the first cooling rate, and wherein the heating element comprises a (Fe—Cr—Al) alloy or a nickel-chrome-iron (Ni—Cr—Fe) alloy.

15. The system according to claim 13, wherein the second cooling rate is at least three times as high as the first cooling rate, and wherein the heating element comprises a (Fe—Cr—Al) alloy or a nickel-chrome-iron (Ni—Cr—Fe) alloy.

* * * * *